(12) United States Patent
Yoon et al.

(10) Patent No.: US 10,249,367 B2
(45) Date of Patent: Apr. 2, 2019

(54) SEMICONDUCTOR APPARATUS COMPRISING A PLURALITY OF CURRENT SINK UNITS

(71) Applicant: SK hynix Inc., Icheon-si, Gyeonggi-do (KR)

(72) Inventors: Jung Hyuk Yoon, Icheon-si (KR); Yoon Jae Shin, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 141 days.

(21) Appl. No.: 15/583,543

(22) Filed: May 1, 2017

(65) Prior Publication Data

US 2017/0236583 A1    Aug. 17, 2017

Related U.S. Application Data

(62) Division of application No. 14/081,765, filed on Nov. 15, 2013, now Pat. No. 9,659,640.

(30) Foreign Application Priority Data

Aug. 22, 2013 (KR) .................. 10-2013-0099819

(51) Int. Cl.
*G11C 11/00*    (2006.01)
*G11C 13/00*    (2006.01)
(Continued)

(52) U.S. Cl.
CPC ........ *G11C 13/0028* (2013.01); *G06F 3/0604* (2013.01); *G06F 3/0659* (2013.01);
(Continued)

(58) Field of Classification Search
CPC . G11C 11/16; G11C 13/0069; G11C 13/0002; G11C 13/0023; G11C 13/0038; G11C 13/004

See application file for complete search history.

(56) References Cited

U.S. PATENT DOCUMENTS 5,321,658 A    6/1994  Ishimura et al.
5,534,793 A    7/1996  Nasserbakht
(Continued)

FOREIGN PATENT DOCUMENTS

CN    101034589 A    9/2007
CN    101256830 A    9/2008
CN    101675481 A    3/2010

*Primary Examiner* — Gene N Auduong
(74) *Attorney, Agent, or Firm* — William Park & Associates Ltd.

(57) ABSTRACT

A semiconductor memory apparatus includes a column address decoding unit configured to decode a column address and generate a column select signal; a row address decoding unit configured to decode a row address and generate a word line select signal; a driving driver unit configured to provide different voltages to a plurality of resistive memory elements in response to the column select signal; a sink current control unit configured to generate a plurality of sink voltages with different voltage levels in response to the word line select signal; and a plurality of current sink units configured to flow current from the plurality of respective resistive memory elements to a ground terminal in response to the plurality of sink voltages.

6 Claims, 7 Drawing Sheets

(51) Int. Cl.
  *G11C 11/16*     (2006.01)
  *G06F 3/06*      (2006.01)

(52) U.S. Cl.
  CPC ............ *G06F 3/0673* (2013.01); *G11C 11/16* (2013.01); *G11C 11/1653* (2013.01); *G11C 11/1659* (2013.01); *G11C 13/0002* (2013.01); *G11C 13/004* (2013.01); *G11C 13/0023* (2013.01); *G11C 13/0038* (2013.01); *G11C 13/0069* (2013.01)

(56) References Cited

U.S. PATENT DOCUMENTS

| | | | |
|---|---|---|---|
| 6,236,611 | B1 | 5/2001 | Naji |
| 9,659,646 | B1* | 5/2017 | Asnaashari ........ G11C 13/0069 |
| 2001/0053094 | A1 | 12/2001 | Otsuka |
| 2004/0183559 | A1 | 9/2004 | Ware et al. |
| 2005/0013184 | A1 | 1/2005 | Baker |
| 2006/0158919 | A1* | 7/2006 | Inaba ..................... G11C 5/063 |
| | | | 365/63 |
| 2007/0058424 | A1* | 3/2007 | Inaba ..................... G11C 11/16 |
| | | | 365/158 |
| 2008/0218394 | A1 | 9/2008 | Minerva |
| 2009/0322370 | A1 | 12/2009 | Ware et al. |
| 2012/0014166 | A1 | 1/2012 | Ma et al. |
| 2012/0228159 | A1 | 9/2012 | Levine |
| 2012/0320657 | A1 | 12/2012 | Chung |
| 2013/0182521 | A1 | 7/2013 | Jang |

* cited by examiner

SEMICONDUCTOR APPARATUS COMPRISING A PLURALITY OF CURRENT SINK UNITS

CROSS-REFERENCES TO RELATED APPLICATION

The present application is a divisional application of U.S. application Ser. No. 14/081,765, filed on Nov. 15, 2013, and claims priority under 35 U.S.C. § 119(a) to Korean application number 10-2013-0099819, filed on Aug. 22, 2013, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to store data and output stored data. According to methods of storing inputted data, semiconductor memory apparatuses are classified into various kinds.

Research has been conducted for a semiconductor memory apparatus which is configured to store data by changing the resistance value of a memory cell according to the data value of inputted data and output stored data by discriminating the resistance value of the memory cell.

Figure 1:
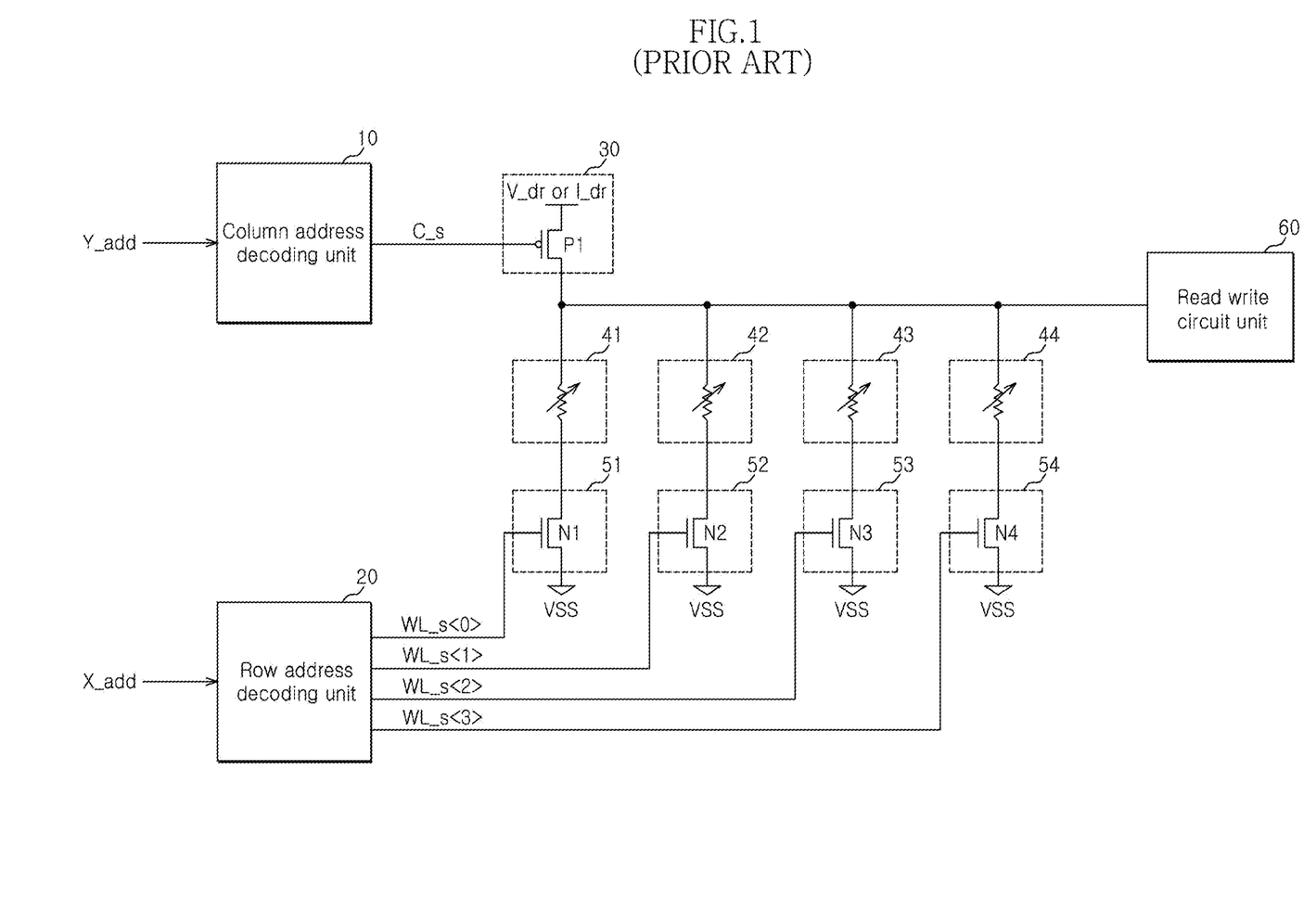
FIG. 1 is a configuration diagram of a conventional semiconductor memory apparatus.

Referring to FIG. 1, such a semiconductor memory apparatus includes a column address decoding unit 10, a row address decoding unit 20, a driving driver unit 30, first to fourth resistive memory elements 41 to 44, first to fourth current sink units 51 to 54, and a read write circuit unit 60.

The semiconductor memory apparatus configured in this way operates as follows.

The column address decoding unit 10 decodes a column address Y_add and enables a column select signal C_s.

The row address decoding unit 20 decodes a row address X_add, and generates first to fourth word line select signals WL_s<0:3>. Only one of the first to fourth word line select signals WL_s<0:3> is enabled at a time.

The driving driver unit 30 includes a driving driver P1 and provides a driving voltage V_dr or driving current I_dr to the first to fourth resistive memory elements 41 to 44 in response to the column select signal C_s.

The first current sink unit 51 includes a first transistor N1. The first transistor N1 has a gate which is applied with the first word line select signal WL_s<0>, a drain to which the first resistive memory element 41 is electrically coupled, and a source to which the ground terminal VSS is electrically coupled. As such, the first current sink unit 51 flows current from the first resistive memory element 41 to a ground terminal VSS in response to the first word line select signal WL_s<0>.

The second current sink unit 52 includes a second transistor N2. The second transistor N2 has a gate which is applied with the second word line select signal WL_s<1>, a drain to which the second resistive memory element 42 is electrically coupled, and a source to which the ground terminal VSS is electrically coupled. As such, the second current sink unit 52 flows current from the second resistive memory element 42 to the ground terminal VSS in response to the second word line select signal WL_s<1>.

The third current sink unit 53 includes a third transistor N3. The third transistor N3 has a gate which is applied with the third word line select signal WL_s<2>, a drain to which the third resistive memory element 43 is electrically coupled, and a source to which the ground terminal VSS is electrically coupled. As such, the third current sink unit 53 flows current from the third resistive memory element 43 to the ground terminal VSS in response to the third word line select signal WL_s<2>.

The fourth current sink unit 54 includes a fourth transistor N4. The fourth transistor N4 has a gate which is applied with the fourth word line select signal WL_s<3>, a drain to which the fourth resistive memory element 44 is electrically coupled, and a source to which the ground terminal VSS is electrically coupled. As such, the fourth current sink unit 54 flows current from the fourth resistive memory element 44 to the ground terminal VSS in response to the fourth word line select signal WL_s<3>.

The read write circuit unit 60 performs read operations by being provided with current or voltages from the resistive memory elements 41 to 44 selected by the first to fourth word line select signals WL_s<0:3> and the column select signal C_s, and performs write operations by providing current or voltages to the selected resistive memory elements 41 to 44. Selected resistive memory elements refer to resistive memory elements through which current may flow, among the first to fourth resistive memory elements 41 to 44, in response to the column select signal C_s and the first to fourth word line select signals WL_s<0:3>.

As shown in FIG. 1, the conventional semiconductor memory apparatus is configured such that the plurality of resistive memory elements 41 to 44 are provided with current or voltages from the one driving driver unit 30. Therefore, the resistive memory element 41 closest to the driving driver unit 30 is provided with a largest amount of current or a highest voltage, and the resistive memory element 44 farthest from the driving driver unit 30 is provided with a smallest amount of current or a lowest voltage. That is to say, since the distances between the driving driver unit 30 and the first to fourth respective resistive memory elements 41 to 44 are different, the respective resistive memory elements 41 to 44 are provided with different amounts of current or different levels of voltages. As a result, when sensing (reading) the resistance values of the first to fourth resistive memory elements 41 to 44 or changing (writing) the resistance values of the first to fourth resistive memory elements 41 to 44, it may be difficult to normally perform the read and write operations, due to such a problem.

SUMMARY

A semiconductor memory apparatus capable of securing the stability and reliability of data is described herein.

In an embodiment of the present invention, a semiconductor memory apparatus includes: a column address decoding unit configured to decode a column address and generate a column select signal; a row address decoding unit configured to decode a row address and generate a word line select signal; a driving driver unit configured to provide different voltages to a plurality of resistive memory elements in response to the column select signal; a sink current control unit configured to generate a plurality of sink voltages with different voltage levels in response to the word line select signal; and a plurality of current sink units configured to flow current from the plurality of respective resistive memory elements to a ground terminal in response to the plurality of sink voltages.

In an embodiment of the present invention, a semiconductor memory apparatus may include: a driving driver unit configured to provide voltages with different voltage levels to a plurality of resistive memory elements, respectively, in response to a column select signal; a plurality of current sink units configured to flow current from the plurality of respective resistive memory elements to a ground terminal in response to a plurality of sink voltages; and a sink current control unit configured to generate the plurality of sink voltages with different voltage levels in response to a plurality of word line select signals.

In an embodiment of the present invention, a semiconductor memory apparatus may include: a driving driver unit configured to provide voltages with different voltage levels to a plurality of respective resistive memory elements in response to a column select signal; a plurality of current sink units configured to flow current from one of the plurality of resistive memory elements to a ground terminal in response to a plurality of word line select signals; and a current sink control unit configured to flow different amounts of current from the plurality of current sink units to the ground terminal.

In an embodiment of the present invention, a microprocessor includes: a control unit configured to receive a signal including a command from the outside and perform extraction or decryption of the command or input or output control; an operation unit configured to perform an operation according to a decryption result of the command in the control unit; and a storage unit configured to store one or more among data to be operated, data corresponding to a result of the operation, and an address for the data to be operated, wherein the storage unit includes a semiconductor memory apparatus includes: a column address decoding unit configured to decode a column address and generate a column select signal; a row address decoding unit configured to decode a row address and generate a word line select signal; a driving driver unit configured to provide different voltages to a plurality of resistive memory elements in response to the column select signal; a sink current control unit configured to generate a plurality of sink voltages with different voltage levels in response to the word line select signal; and a plurality of current sink units configured to flow current from the plurality of respective resistive memory elements to a ground terminal in response to the plurality of sink voltages.

In an embodiment of the present invention, a processor includes: a core unit configured to perform an operation corresponding to a command input from the outside using data according to the command; a cache semiconductor device unit configured to store one or more among data to be operated, data corresponding to a result of the operation, and an address for the data to be operated; and a bus interface configured to be connected between the core unit and the cache semiconductor device unit, and transmit data between the core unit and the cache semiconductor device unit, wherein the cache semiconductor device unit includes a semiconductor memory apparatus including: a driving driver unit configured to provide voltages with different voltage levels to a plurality of resistive memory elements, respectively, in response to a column select signal; a plurality of current sink units configured to flow current from the plurality of respective resistive memory elements to a ground terminal in response to a plurality of sink voltages; and a sink current control unit configured to generate the plurality of sink voltages with different voltage levels in response to a plurality of word line select signals.

In an embodiment of the present invention, a processor includes: a processor configured to interpret a command input from the outside and control an operation of information according to an interpretation result of the command; an auxiliary storage device configured to store a program for interpretation of the command, and the information; a main storage device configured to transfer the program and information from the auxiliary storage device and store the program and the information so that the processor performs the operation using the program and information when the program is executed; and an interface device configured to perform communication between the outside and one or more among the processor, the auxiliary storage device, and the main storage device, wherein at least one of the auxiliary storage device and the main storage device includes a semiconductor memory apparatus including: a driving driver unit configured to provide voltages with different voltage levels to a plurality of respective resistive memory elements in response to a column select signal; a plurality of current sink units configured to flow current from one of the plurality of resistive memory elements to a ground terminal in response to a plurality of word line select signals; and a current sink control unit configured to flow different amounts of current from the plurality of current sink units to the ground terminal.

Thanks to the above embodiments, the semiconductor memory apparatus according to the present disclosure may improve the stability and reliability of read and write operations.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through various examples of embodiments.

Figure 2:
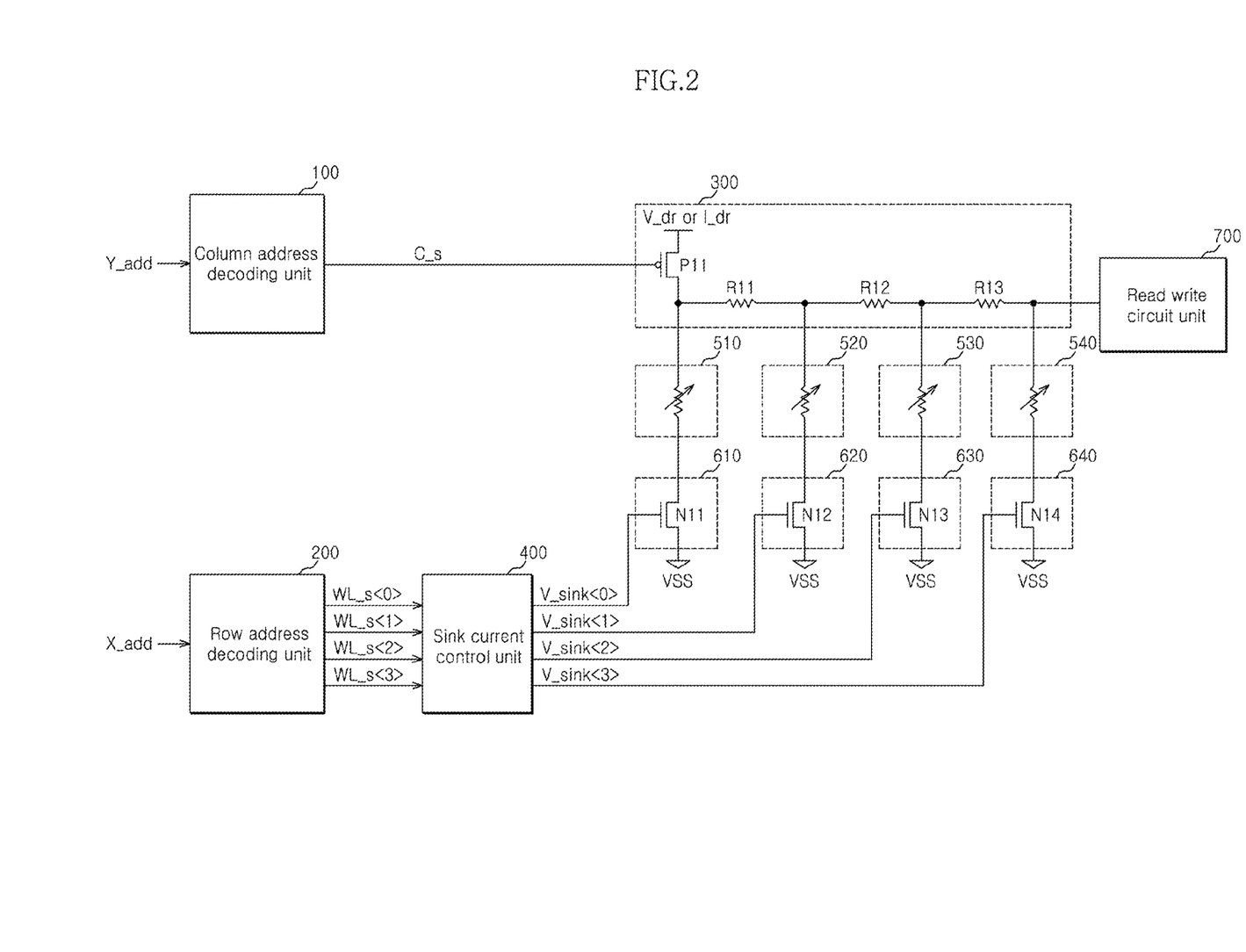
FIG. 2 is a configuration diagram of a semiconductor memory apparatus in accordance with an embodiment of the present disclosure.

Referring to FIG. 2, a semiconductor memory apparatus in accordance with an embodiment of the present disclosure includes a column address decoding unit 100, a row address decoding unit 200, a driving driver unit 300, a sink current control unit 400, first to fourth resistive memory elements 510, 520, 530 and 540, first to fourth current sink units 610, 620, 630 and 640, and a read write circuit unit 700.

The column address decoding unit 100 is configured to decode a column address Y_add, and generate a column select signal C_s.

The row address decoding unit 200 is configured to decode a row address X_add, and generate first to fourth word line select signals WL_s<0:3>. For example, the row address decoding unit 200 decodes the row address X_add and enables one of the first to fourth word line select signals WL_s<0:3> at a time.

The driving driver unit 300 is configured to provide different voltages or current to the first to fourth resistive memory elements 510, 520, 530 and 540 in response to the column select signal C_s. The driving driver unit 300 includes a driving driver P11 which provides a driving voltage V_dr or driving current I_dr in response to the column select signal C_s. The driving driver unit 300 provides different levels of voltages to the first to fourth resistive memory elements 510, 520, 530 and 540 according to the distances between the driving driver P11 and the first to fourth respective resistive memory elements 510, 520, 530 and 540. For example, the driving driver unit 300 provides a lower voltage as a resistive memory element becomes farther from the driving driver P11. The driving voltage V_dr or the driving current I_dr is generated from a circuit for controlling read and write operations, in a read operation or a write operation.

The driving driver unit 300 includes the driving driver P11, and first to third resistor elements R11, R12 and R13 which are electrically coupled in series.

The driving driver P11 includes a first transistor P11. The first transistor P11 has the gate which is inputted with the column select signal C_s, and the source which is applied with the driving voltage V_dr or the driving current I_dr. While it is exemplified that the driving driver P11 is realized by a PMOS transistor, it is to be noted that the driving driver P11 may be realized by an NMOS transistor or may be realized by a pass gate.

The first resistor element R11 has one end to which the drain of the first transistor P11 is electrically coupled.

The second resistor element R12 has one end to which the other end of the first resistor element R11 is electrically coupled.

The third resistor element R13 has one end to which the other end of the second resistor element R12 is electrically coupled.

The first resistive memory element 510 is electrically coupled to the node where the driving driver P11 and the first resistor element R11 are electrically coupled. The second resistive memory element 520 is electrically coupled to the node where the first resistor element R11 and the second resistor element R12 are electrically coupled. The third resistive memory element 530 is electrically coupled to the node where the second resistor element R12 and the third resistor element R13 are electrically coupled. The fourth resistive memory element 540 is electrically coupled to the other end of the third resistor element R13. The read write circuit block 700 is electrically coupled to the node where the third resistor element R13 and the fourth resistive memory element 540 are electrically coupled. The last resistor element R13 among the first to third resistor elements R11 to R13 which are electrically coupled in series is electrically coupled with the read write circuit unit 700.

The sink current control unit 400 is configured to generate first to fourth sink voltages V_sink<0:3> with different voltage levels, in response to the first to fourth word line select signals WL_s<0:3>. For example, the sink current control unit 400 provides the first to fourth respective sink voltages V_sink<0:3> to the first to fourth current sink units 610, 620, 630 and 640 respectively electrically coupled to the first to fourth resistive memory elements 510 to 540 according to the distances between the driving driver P11 and the first to fourth resistive memory elements 510 to 540. In detail, the sink current control unit 400 provides a sink voltage with a lower voltage level to a current sink unit which is electrically coupled to a resistive memory element closer to the driving driver P11.

The first resistive memory element 510 has one end to which the node where the driving driver P11 and the first resistor element R11 are electrically coupled is electrically coupled, and the other end to which the first current sink unit 610 is electrically coupled.

The second resistive memory element 520 has one end to which the node where the first resistor element R11 and the second resistor element R12 are electrically coupled is electrically coupled, and the other end to which the second current sink unit 620 is electrically coupled.

The third resistive memory element 530 has one end to which the node where the second resistor element R12 and the third resistor element R13 are electrically coupled is electrically coupled, and the other end to which the third current sink unit 630 is electrically coupled.

The fourth resistive memory element 540 has one end to which the node where the third resistor element R13 and the read write circuit unit 700 are electrically coupled is electrically coupled, and the other end to which the fourth current sink unit 640 is electrically coupled.

The first current sink unit 610 is configured to flow current from the first resistive memory element 510 to a ground terminal VSS in response to the first sink voltage V_sink<0>. For example, the first current sink unit 610 flows an increased amount of current from the first resistive memory element 510 to the ground terminal VSS as the voltage level of the first sink voltage V_sink<0> is high.

The first current sink unit 610 includes a second transistor N11. The second transistor N11 has the gate which is applied with the first sink voltage V_sink<0>, the drain to which the first resistive memory element 510 is electrically coupled, and the source to which the ground terminal VSS is electrically coupled.

The second current sink unit 620 is configured to flow current from the second resistive memory element 520 to the ground terminal VSS in response to the second sink voltage V_sink<1>. For example, the second current sink unit 620 flows an increased amount of current from the second resistive memory element 520 to the ground terminal VSS as the voltage level of the second sink voltage V_sink<1> is high.

The second current sink unit 620 includes a third transistor N12. The third transistor N12 has the gate which is applied with the second sink voltage V_sink<1>, the drain to which the second resistive memory element 520 is electrically coupled, and the source to which the ground terminal VSS is electrically coupled.

The third current sink unit 630 is configured to flow current from the third resistive memory element 530 to the ground terminal VSS in response to the third sink voltage V_sink<2>. For example, the third current sink unit 630 flows an increased amount of current from the third resistive memory element 530 to the ground terminal VSS as the voltage level of the third sink voltage V_sink<2> is high.

The third current sink unit 630 includes a fourth transistor N13. The fourth transistor N13 has the gate which is applied with the third sink voltage V_sink<2>, the drain to which the third resistive memory element 530 is electrically coupled, and the source to which the ground terminal VSS is electrically coupled.

The fourth current sink unit 640 is configured to flow current from the fourth resistive memory element 540 to the ground terminal VSS in response to the fourth sink voltage V_sink<3>. For example, the fourth current sink unit 640 flows an increased amount of current from the fourth resistive memory element 540 to the ground terminal VSS as the voltage level of the fourth sink voltage V_sink<3> is high.

The fourth current sink unit 640 includes a fifth transistor N14. The fifth transistor N14 has the gate which is applied with the fourth sink voltage V_sink<3>, the drain to which the fourth resistive memory element 540 is electrically coupled, and the source to which the ground terminal VSS is electrically coupled.

The read write circuit unit 700 is configured to amplify and output the current or voltage of a node electrically coupled thereto in a read operation, or apply a voltage or current to a node electrically coupled thereto in a write operation.

Figure 3:
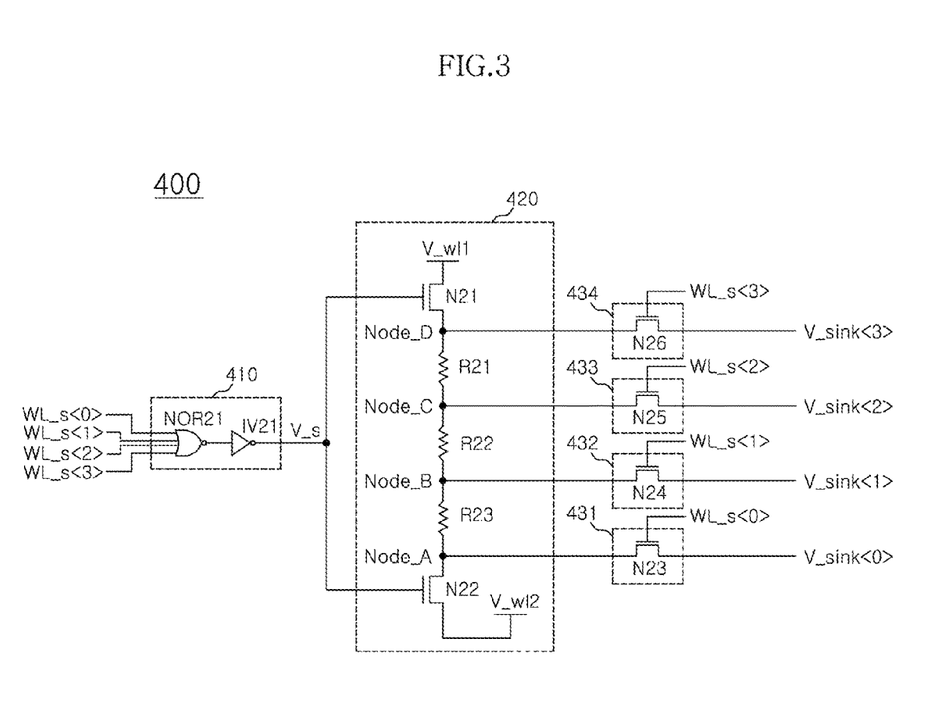
FIG. 3 is a configuration diagram of the sink current control unit of FIG. 2.

Referring to FIG. 3, the sink current control unit 400 includes a voltage supply signal generating section 410, a voltage dividing section 420, and first to fourth switching sections 431, 432, 433 and 434.

The voltage supply signal generating section 410 is configured to enable a voltage supply signal V_s when even one of the first to fourth word line select signals WL_s<0:3> is enabled.

The voltage supply signal generating section 410 includes a NOR gate NOR21, and an inverter IV21. The NOR gate NOR21 is inputted with the first to fourth word line select signals WL_s<0:3>. The inverter IV21 is inputted with the output signal of the NOR gate NOR21 and outputs the voltage supply signal V_s.

The voltage dividing section 420 is configured to generate the first to fourth sink voltages V_sink<0:3> which have voltage levels between the voltage levels of a first word line driving voltage V_wl1 and a second word line driving voltage V_wl2, in response to the voltage supply signal V_s.

The voltage dividing section 420 includes fourth to sixth resistor elements which are electrically coupled in series, and sixth and seventh transistors N21 and N22. The sixth transistor N21 has the gate which is inputted with the voltage supply signal V_s, the drain which is applied with the first word line driving voltage V_wl1, and the source to which one end of the fourth resistor element R21 is electrically coupled. The fifth resistor element R22 has one end to which the other end of the fourth resistor element R21 is electrically coupled. The sixth resistor element R23 has one end to which the other end of the fifth resistor element R22 is electrically coupled. The seventh transistor N22 has the gate which is inputted with the voltage supply signal V_s, the drain which is applied with the second word line driving voltage V_wl2, and the source to which the other end of the sixth resistor element R23 is electrically coupled. The node where the seventh transistor N22 and the sixth resistor element R23 are electrically coupled is a first node Node_A. The node where the sixth resistor element R23 and the fifth resistor element R22 are electrically coupled is a second node Node_B. The node where the fifth resistor element R22 and the fourth resistor element R21 are electrically coupled is a third node Node_C. The node where the fourth resistor element R21 and the sixth transistor N21 are electrically coupled is a fourth node Node_D. The first word line driving voltage V_wl1 is higher than the voltage level of the second word line driving voltage V_wl2. The voltage level of the first node Node_A is lowest, the voltage level of the second node Node_B is second lowest, the voltage level of the third node Node_C is third lowest, and the voltage level of the fourth node Node_D is highest.

The first switching section 431 is configured to output the voltage of the first node Node_A as the first sink voltage V_sink<0> in response to the first word line select signal WL_s<0>. For example, the first switching section 431 outputs the voltage of the first node Node_A as the first sink voltage V_sink<0> when the first word line select signal WL_s<0> is enabled.

The first switching section 431 includes an eighth transistor N23. The eighth transistor N23 has the gate which is inputted with the first word line select signal WL_s<0>, the drain to which the first node Node_A is electrically coupled, and the source which outputs the first sink voltage V_sink<0>.

The second switching section 432 is configured to output the voltage of the second node Node_B as the second sink voltage V_sink<1> in response to the second word line select signal WL_s<1>. For example, the second switching section 432 outputs the voltage of the second node Node_B as the second sink voltage V_sink<1> when the second word line select signal WL_s<1> is enabled.

The second switching section 432 includes a ninth transistor N24. The ninth transistor N24 has the gate which is inputted with the second word line select signal WL_s<1>, the drain to which the second node Node_B is electrically coupled, and the source which outputs the second sink voltage V_sink<1>.

The third switching section 433 is configured to output the voltage of the third node Node_C as the third sink voltage V_sink<2> in response to the third word line select signal WL_s<2>. For example, the third switching section 433 outputs the voltage of the third node Node_C as the third sink voltage V_sink<2> when the third word line select signal WL_s<2> is enabled.

The third switching section 433 includes a tenth transistor N25. The tenth transistor N25 has the gate which is inputted with the third word line select signal WL_s<2>, the drain to which the third node Node_C is electrically coupled, and the source which outputs the third sink voltage V_sink<2>.

The fourth switching section 434 is configured to output the voltage of the fourth node Node_D as the fourth sink voltage V_sink<3> in response to the fourth word line select signal WL_s<3>. For example, the fourth switching section 434 outputs the voltage of the fourth node Node_D as the fourth sink voltage V_sink<3> when the fourth word line select signal WL_s<3> is enabled.

The fourth switching section 434 includes an eleventh transistor N26. The eleventh transistor N26 has the gate which is inputted with the fourth word line select signal WL_s<3>, the drain to which the fourth node Node_D is electrically coupled, and the source which outputs the fourth sink voltage V_sink<3>. The voltage level of the first sink voltage V_sink<0> is lowest, the voltage level of the second sink voltage V_sink<1> is second lowest, the voltage level of the third sink voltage V_sink<2> is third lowest, and the voltage level of the fourth sink voltage V_sink<3> is highest.

The semiconductor memory apparatus in accordance with the embodiments of the present disclosure, configured as mentioned above, may operate as follows.

The semiconductor memory apparatus is inputted with the column address Y_add and the row address X_add from an outside.

The column address decoding unit 100 decodes the column address Y_add and generates the column select signal C_s.

The row address decoding unit 200 decodes the row address X_add and generates the first to fourth word line select signals WL_s<0:3>.

The driving driver unit 300 provides voltages with different voltage levels, to the first to fourth resistive memory elements 510, 520, 530 and 540 in response to the column select signal C_s. For example, the driving driver unit 300 provides a highest voltage to the first resistive memory element 510 closest to the driving driver P11. The driving driver unit 300 provides a second highest voltage to the second resistive memory element 520 second closest to the driving driver P11. The driving driver unit 300 provides a third highest voltage to the third resistive memory element 530 third closest to the driving driver P11. The driving driver unit 300 provides a lowest voltage to the fourth resistive memory element 540 farthest from the driving driver P11.

The sink current control unit 400 generates the first to fourth sink voltages V_sink<0:3> with different voltage levels, in response to the first to fourth word line select signals WL_s<0:3>. Among the first to fourth sink voltages V_sink<0:3>, the voltage level of the first sink voltage V_sink<0> is lowest, the voltage level of the second sink voltage V_sink<1> is second lowest, the voltage level of the third sink voltage V_sink<2> is third lowest, and the voltage level of the fourth sink voltage V_sink<3> is highest. The sink current control unit 400 outputs one voltage of the first to fourth sink voltages V_sink<0:3> in response to the first to fourth word line select signals WL_s<0:3>. The sink current control unit 400 outputs the first sink voltage V_sink<0> when the first word line select signal WL_s<0> is enabled, outputs the second sink voltage V_sink<1> when the second word line select signal WL_s<1> is enabled, outputs the third sink voltage V_sink<2> when the third word line select signal WL_s<2> is enabled, and outputs the fourth sink voltage V_sink<3> when the fourth word line select signal WL_s<3> is enabled.

The first current sink unit 610 flows current from the first resistive memory element 510 to the ground terminal VSS in response to the first sink voltage V_sink<0>.

The second current sink unit 620 flows current from the second resistive memory element 520 to the ground terminal VSS in response to the second sink voltage V_sink<1>.

The third current sink unit 630 flows current from the third resistive memory element 530 to the ground terminal VSS in response to the third sink voltage V_sink<2>.

The fourth current sink unit 640 flows current from the fourth resistive memory element 540 to the ground terminal VSS in response to the fourth sink voltage V_sink<3>.

Since the first current sink unit 610 is applied with the first sink voltage V_sink<0> of which voltage level is lowest among the first to fourth sink voltages V_sink<0:3>, the amount of current flowed from the first resistive memory element 510 to the ground terminal VSS is smallest.

Since the second current sink unit 620 is applied with the second sink voltage V_sink<1> of which voltage level is second lowest among the first to fourth sink voltages V_sink<0:3>, the amount of current flowed from the second resistive memory element 520 to the ground terminal VSS is second smallest.

Since the third current sink unit 630 is applied with the third sink voltage V_sink<2> of which voltage level is third lowest among the first to fourth sink voltages V_sink<0:3>, the amount of current flowed from the third resistive memory element 530 to the ground terminal VSS is third smallest.

Since the fourth current sink unit 640 is applied with the fourth sink voltage V_sink<3> of which voltage level is highest among the first to fourth sink voltages V_sink<0:3>, the amount of current flowed from the fourth resistive memory element 540 to the ground terminal VSS is largest.

The first resistive memory element 510, which is closest to the driving driver P11, flows the smallest amount of current to the ground terminal VSS while it is applied with a highest voltage, that is, a largest amount of current, among the first to fourth resistive memory elements 510 to 540.

The second resistive memory element 520, which is second closest to the driving driver P11, flows the second smallest amount of current to the ground terminal VSS while it is applied with a second highest voltage, that is, a second largest amount of current, among the first to fourth resistive memory elements 510 to 540.

The third resistive memory element 530, which is third closest to the driving driver P11, flows the third smallest amount of current to the ground terminal VSS while it is applied with a third highest voltage, that is, a third largest amount of current, among the first to fourth resistive memory elements 510 to 540.

The fourth resistive memory element 540, which is farthest from the driving driver P11, flows the largest amount of current to the ground terminal VSS while it is applied with a lowest voltage, that is, a smallest amount of current, among the first to fourth resistive memory elements 510 to 540.

The semiconductor memory apparatus in accordance with the embodiments of the present disclosure provides a higher voltage level as a resistive memory element is closer to the driving driver P11, and flows a smaller amount of current to the ground terminal VSS as a resistive memory element is closer to the driving driver P11.

In other words, the semiconductor memory apparatus in accordance with the embodiments of the present disclosure may cause the same amount of current to flow to all resistive memory elements regardless of distances from the driving driver P11.

As a consequence, the semiconductor memory apparatus in accordance with the embodiments of the present disclosure may improve the reliability and stability of read and write operations by causing the same amount of current to flow to all resistive memory elements selected by column addresses and row addresses.

Figure 4:
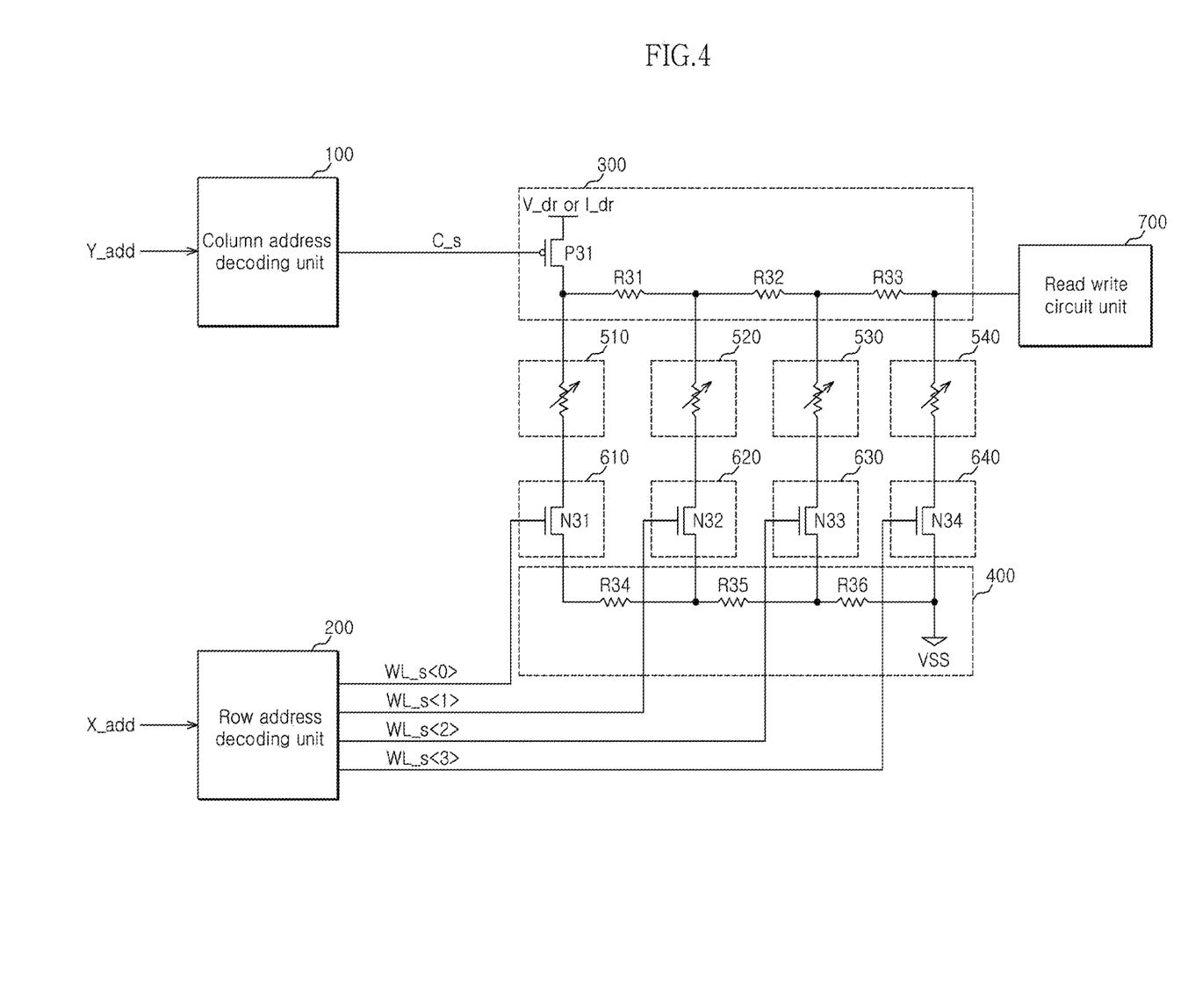
FIG. 4 is a configuration diagram of a semiconductor memory apparatus in accordance with an embodiment of the present disclosure.

Referring to FIG. 4, a semiconductor memory apparatus in accordance with an embodiment of the present disclosure includes a column address decoding unit 100, a row address decoding unit 200, a driving driver unit 300, a current sink control unit 400, first to fourth resistive memory elements 510, 520, 530 and 540, first to fourth current sink units 610, 620, 630 and 640, and a read write circuit unit 700.

The column address decoding unit 100 is configured to decode a column address Y_add, and generate a column select signal C_s.

The row address decoding unit 200 is configured to decode a row address X_add, and generate first to fourth word line select signals WL_s<0:3>. For example, the row address decoding unit 200 decodes the row address X_add and enables one of the first to fourth word line select signals WL_s<0:3> at a time.

The driving driver unit 300 is configured to provide different voltages to the first to fourth resistive memory elements 510, 520, 530 and 540 in response to the column select signal C_s. The driving driver unit 300 includes a driving driver P31 which provides a driving voltage V_dr or a driving current I_dr in response to the column select signal C_s. The driving driver unit 300 provides different levels of voltages to the first to fourth resistive memory elements 510, 520, 530 and 540 according to the distances between the driving driver P31 and the first to fourth respective resistive memory elements 510, 520, 530 and 540. For example, the driving driver unit 300 provides a lower voltage as a resistive memory element becomes farther from the driving driver P31.

The driving driver unit 300 includes the driving driver P31, and first to third resistor elements R31, R32 and R33 which are electrically coupled in series.

The driving driver P31 includes a first transistor P31. The first transistor P31 has the gate which is inputted with the column select signal C_s, and the source which is applied with the driving voltage V_dr or the driving current I_dr.

The first resistor element R31 has one end to which the drain of the first transistor P31 is electrically coupled.

The second resistor element R32 has one end to which the other end of the first resistor element R31 is electrically coupled.

The third resistor element R33 has one end to which the other end of the second resistor element R32 is electrically coupled.

The first resistive memory element 510 is electrically coupled to the node where the driving driver P31 and the first resistor element R31 are electrically coupled. The second resistive memory element 520 is electrically coupled to the node where the first resistor element R31 and the second resistor element R32 are electrically coupled. The third resistive memory element 530 is electrically coupled to the node where the second resistor element R32 and the third resistor element R33 are electrically coupled. The fourth resistive memory element 540 is electrically coupled to the other end of the third resistor element R33. The read write circuit block 700 is electrically coupled to the node where the third resistor element R33 and the fourth resistive memory element 540 are electrically coupled. The last resistor element R33 among the first to third resistor elements R31 to R33 which are electrically coupled in series is electrically coupled with the read write circuit unit 700.

The first current sink unit 610 is electrically coupled to the first resistive memory element 510, and is configured to flow current from the first resistive memory element 510 to the current sink control unit 400 in response to the first word line select signal WL_s<0>.

The first current sink unit 610 includes a second transistor N31. The second transistor N31 has the gate which is applied with the first word line select signal WL_s<0>, the drain to which the first resistive memory element 510 is electrically coupled, and the source to which the current sink control unit 400 is electrically coupled.

The second current sink unit 620 is electrically coupled to the second resistive memory element 520, and is configured to flow current from the second resistive memory element 520 to the current sink control unit 400 in response to the second word line select signal WL_s<1>.

The second current sink unit 620 includes a third transistor N32. The third transistor N32 has the gate which is applied with the second word line select signal WL_s<1>, the drain to which the second resistive memory element 520 is electrically coupled, and the source to which the current sink control unit 400 is electrically coupled.

The third current sink unit 630 is electrically coupled to the third resistive memory element 530, and is configured to flow current from the third resistive memory element 530 to the current sink control unit 400 in response to the third word line select signal WL_s<2>.

The third current sink unit 630 includes a fourth transistor N33. The fourth transistor N33 has the gate which is applied with the third word line select signal WL_s<2>, the drain to which the third resistive memory element 530 is electrically coupled, and the source to which the current sink control unit 400 is electrically coupled.

The fourth current sink unit 640 is electrically coupled to the fourth resistive memory element 540, and is configured to flow current from the fourth resistive memory element 540 to the current sink control unit 400 in response to the fourth word line select signal WL_s<3>.

The fourth current sink unit 640 includes a fifth transistor N34. The fifth transistor N34 has the gate which is applied with the fourth word line select signal WL_s<3>, the drain to which the fourth resistive memory element 540 is electrically coupled, and the source to which the current sink control unit 400 is electrically coupled.

The current sink control unit 400 is configured to flow different amounts of current from the first to fourth respective current sink units 610 to 640 to a ground terminal VSS. For example, the current sink control unit 400 causes the amounts of current which are flowed to the ground terminal VSS by the first to fourth current sink units 610 to 640 electrically coupled to the first to fourth respective resistive memory elements 510 to 540, to become different according to the respective distances between the driving driver P31 and the first to fourth resistive memory elements 510 to 540.

The current sink control unit 400 includes fourth to sixth resistor elements R34, R35 and R36. The fourth resistor element R34 is electrically coupled between the first and second current sink units 610 and 620. The fifth resistor element R35 is electrically coupled between the second and third current sink units 620 and 630. The sixth resistor element R36 is electrically coupled between the third current sink unit 630 and the ground terminal VSS.

The first current sink unit 610 flows current from the first resistive memory element 510 through the fourth to sixth resistor elements R34 to R36 to the ground terminal VSS when the first word line select signal WL_s<0> is enabled.

The second current sink unit 620 flows current from the second resistive memory element 520 through the fifth and sixth resistor elements R35 and R36 to the ground terminal VSS when the second word line select signal WL_s<1> is enabled.

The third current sink unit 630 flows current from the third resistive memory element 530 through the sixth resistor element R36 to the ground terminal VSS when the third word line select signal WL_s<2> is enabled.

The fourth current sink unit 640 flows current from the fourth resistive memory element 540 to the ground terminal VSS when the fourth word line select signal WL_s<3> is enabled.

Therefore, in the current sink control unit 400, the amount of current flowed from a current sink unit electrically coupled to a resistive memory element close to the driving driver P31, to the ground terminal VSS is smaller than the amount of current flowed from a current sink unit electrically coupled to a resistive memory element distant from the driving driver P31, to the ground terminal VSS.

Operations of the semiconductor memory apparatus in accordance with the embodiments of the present disclosure, configured as mentioned above, will be described below.

The semiconductor memory apparatus is inputted with the column address Y_add and the row address X_add from an outside.

The column address decoding unit 100 decodes the column address Y_add and generates the column select signal C_s.

The row address decoding unit 200 decodes the row address X_add and generates the first to fourth word line select signals WL_s<0:3>.

The driving driver unit 300 provides voltages with different voltage levels, to the first to fourth resistive memory elements 510, 520, 530 and 540 in response to the column select signal C_s. For example, the driving driver unit 300 provides a highest voltage to the first resistive memory element 510 closest to the driving driver P31. The driving driver unit 300 provides a second highest voltage to the second resistive memory element 520 second closest to the driving driver P31. The driving driver unit 300 provides a third highest voltage to the third resistive memory element 530 third closest to the driving driver P31. The driving driver unit 300 provides a lowest voltage to the fourth resistive memory element 540 farthest from the driving driver P31.

The first current sink unit 610 flows current from the first resistive memory element 510 to the current sink control unit 400 in response to the first word line select signal WL_s<0>.

The second current sink unit 620 flows current from the second resistive memory element 520 to the current sink control unit 400 in response to the second word line select signal WL_s<1>.

The third current sink unit 630 flows current from the third resistive memory element 530 to the current sink control unit 400 in response to the third word line select signal WL_s<2>.

The fourth current sink unit 640 flows current from the fourth resistive memory element 540 to the current sink control unit 400 in response to the fourth word line select signal WL_s<3>.

Since the first current sink unit 610 flows current through the fourth to sixth resistor elements R34 to R36 of the current sink control unit 400 to the ground terminal VSS when the first word line select signal WL_s<0> is enabled, the amount of current flowed from the first resistive memory element 510 to the ground terminal VSS by the first current sink unit 610 is smallest.

Since the second current sink unit 620 flows current through the fifth and sixth resistor elements R35 and R36 of the current sink control unit 400 to the ground terminal VSS when the second word line select signal WL_s<1> is enabled, the amount of current flowed from the second resistive memory element 520 to the ground terminal VSS by the second current sink unit 620 is second smallest.

Since the third current sink unit 630 flows current through the sixth resistor element R36 of the current sink control unit 400 to the ground terminal VSS when the third word line select signal WL_s<2> is enabled, the amount of current flowed from the third resistive memory element 530 to the ground terminal VSS by the third current sink unit 630 is third smallest.

Since the fourth current sink unit 640 flows current to the ground terminal VSS when the fourth word line select signal WL_s<3> is enabled, the amount of current flowed from the fourth resistive memory element 540 to the ground terminal VSS by the fourth current sink unit 640 is largest.

The first resistive memory element 510, which is closest to the driving driver P31, flows a smallest amount of current to the ground terminal VSS while it is applied with a highest voltage among the first to fourth resistive memory elements 510 to 540.

The second resistive memory element 520, which is second closest to the driving driver P31, flows a second smallest amount of current to the ground terminal VSS while it is applied with a second highest voltage among the first to fourth resistive memory elements 510 to 540.

The third resistive memory element 530, which is third closest to the driving driver P31, flows a third smallest amount of current to the ground terminal VSS while it is applied with a third highest voltage among the first to fourth resistive memory elements 510 to 540.

The fourth resistive memory element 540, which is farthest from the driving driver P31, flows a largest amount of current to the ground terminal VSS while it is applied with a lowest voltage among the first to fourth resistive memory elements 510 to 540.

The semiconductor memory apparatus in accordance with the embodiments of the present disclosure provide a higher voltage level as a resistive memory element is closer to the driving driver P31, and flows a smaller amount of current to the ground terminal VSS as a resistive memory element is closer to the driving driver P31.

In other words, the semiconductor memory apparatus in accordance with the embodiments of the present disclosure may cause the same amount of current to flow to all resistive memory elements regardless of distances from the driving driver P31.

As a consequence, the semiconductor memory apparatus in accordance with the embodiments of the present disclosure may improve the reliability and stability of read and write operations by causing the same amount of current to flow to all resistive memory elements selected by column addresses and row addresses.

Figure 5:
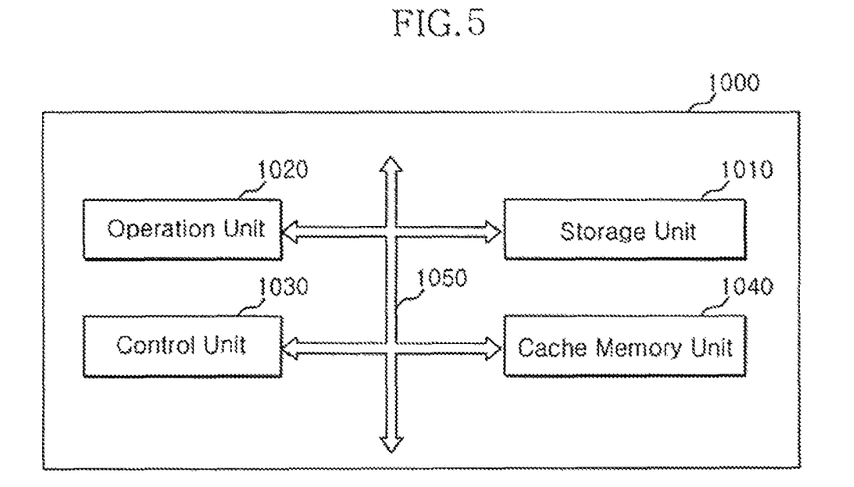
FIG. 5 is a block diagram illustrating a microprocessor according to an embodiment of the present disclosure.

As illustrated in FIG. 5, a microprocessor 1000 to which the semiconductor memory apparatus according to the embodiments is applied may control and adjust a series of processes, which receive data from various external apparatuses, process the data and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may temporarily store data to be operated in the operation unit 1020, resulting data performed in the operation unit 1020, and an address in which data to be operated is stored.

The storage unit 1010 may include one of the semiconductor apparatuses according to embodiments. The storage unit 1010 including the semiconductor memory apparatus according to the above-described embodiments may include a semiconductor memory apparatus which may cause the same amount of current to flow to all resistive memory elements regardless of distances from the driving driver.

The operation unit 1020 may perform an operation in the microprocessor 1000, and perform a variety of four fundamental rules of an arithmetic operation or a logic operation depending on a decryption result of a command in the control unit 1030. The operation unit 1020 may include one or more arithmetic and logic units (ALU).

The control unit 1030 receives a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 suitable for temporarily storing data input from an external apparatus other than the storage unit 1010 or data to be output to an external apparatus. At this time, the cache memory unit 1040 may exchange data from the storage unit 1010, the operation unit 1020, and the control unit 1030 through a bus interface 1050.

Figure 6:
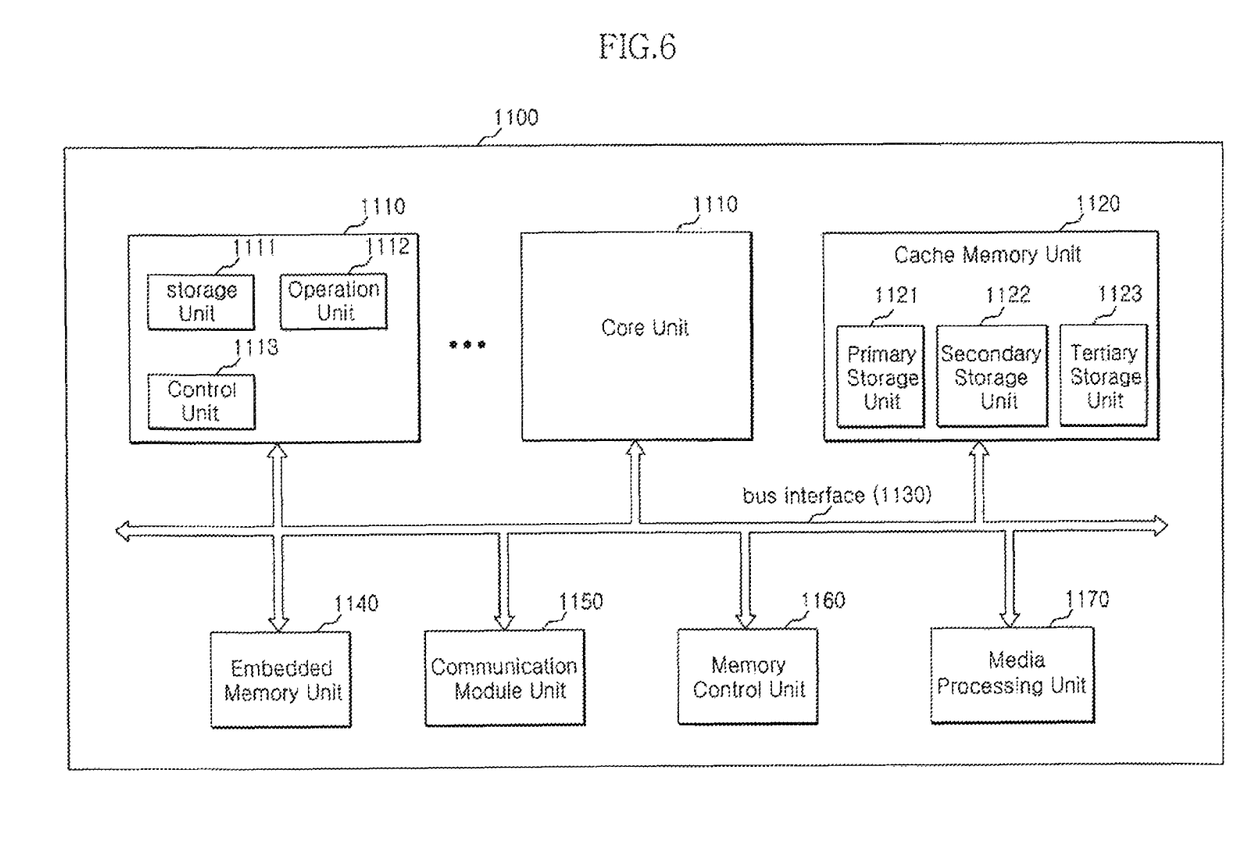
FIG. 6 is a block diagram illustrating a processor according to an embodiment of the present disclosure.

As illustrated in FIG. 6, a processor 1100 according to the embodiments may include various functions to implement performance improvement and multifunction other than the functions of the microprocessor that may control and adjust a series of processes, which receive data from various external apparatuses, process the data and transmit processing results to the external apparatuses. The processor 1100 may include a core unit 1110, a cache memory unit 1120, and a bus interface 1130. The core unit 1110 in the embodiment is a unit may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a GPU, and an AP.

The storage unit 1111 may be a processor register or a register, and the storage unit 1111 may be a unit may store data in the processor 1000 and include a data register, an address register, and a floating point register. The storage unit 1111 may include various registers other than the above-described registers. The storage unit 1111 may temporarily store data to be operated in the operation unit 1112, resulting data performed in the operation unit 1112 and an address in which data to be operated is stored. The operation unit 1112 may be a unit that may perform an operation in the inside of the processor 1100, and perform a variety of four fundamental rules of an arithmetic operation or a logic operation depending on a decryption result of a command in the control unit 1113. The operation unit 1112 may include one or more arithmetic and logic unit (ALU). The control unit 1113 receives a signal from the storage unit 1111, the operation unit 1112, and an external apparatus of the processor 1100, performs extraction or decryption of a command, or input or output control, and executes a process in a program form.

The cache memory unit 1120 may be temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same or different. When the processing rates of the storage units are different, the processing rate of the primary storage unit is the greatest. One or more of the primary storage unit 1121, the secondary storage unit 1122, and the tertiary storage unit 1123 in the cache memory unit may include one of the semiconductor memory apparatus according to the embodiments. The cache memory unit 1120 including the semiconductor memory apparatus according to the above-described embodiments may include a semiconductor memory apparatus which may cause the same amount of current to flow to all resistive memory elements regardless of distances from the driving driver. The detailed configuration of the semiconductor memory apparatus may be the same as the structures illustrated in FIGS. 2-4.

FIG. 6 has illustrated that all the primary, secondary, tertiary storage units 1121, 1122, and 1123 are formed in the cache memory unit 1120. However, all the primary, secondary, tertiary storage units 1121, 1122, and 1123 may be formed in the outside of the cache memory unit 1120, and may supplement a difference between the processing rate of the core unit 1110 and an external apparatus. Further, the primary storage unit 1121 of the cache memory unit 1120 may be located in the core unit 1110, and the secondary storage unit 1122 and the tertiary storage unit 1123 may be formed in the outside of the core unit 1110 to enforce a function to compensate a processing rate.

The bus interface 1130 is a unit that may couple the core unit 1110 and the cache memory unit 1120 to efficiently transmit data.

The processor unit 1100 according to the embodiment may include a plurality of core units 1110, and the core units 1110 may share a cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be formed in each of the core units 1110 corresponding to the number of core units 1110, and the secondary storage unit 1122 and the tertiary storage unit 1123 may be formed in one body in the outsides of the core units 1110 to be shared through the bus interface 1130 Here, the processing rate of the primary storage unit 1121 may be larger than those of the secondary and tertiary storage units 1122 and 1123.

The processor 1100 according to the embodiment may further include an embedded memory unit 1140 that may store data, a communication module unit 1150 that may transmit and receive data from an external apparatus in a wired manner or a wireless manner, a memory control unit 1160 that may drive an external storage device, a media processing unit 1170 that may process data processed in the processor 1100 or data input from an external apparatus and outputting a processing result to an external interface device, and a plurality of modules. At this time, the modules may transmit data to and receive data from the core unit 1110 and the cache memory unit 1120, and transmit and receive data between the modules, through the bus interface 1130.

The embedded memory unit 1140 may include a volatile memory or a nonvolatile memory. The volatile memory may include a dynamic random access memory (DRAM), a mobile DRAM, a static random access memory (SRAM), and the like, and the nonvolatile memory may include a read only memory (ROM), a NOR flash memory, a NAND flash memory, a phase-change random access memory (PRAM), a resistive RAM (RRAM), a spin transfer torque RAM (STTRAM), a magnetic RAM (MRAM), and the like. The semiconductor memory apparatus according to the embodiment may be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, a power line communication (PLC), and the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may be a unit that may manage data transmitted between the processor 1100 and an external apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCM-CIA), a USB, a secure digital (SD) card, a mini secure digital (mSD) card, a micro SD card, a secure digital high capacity (SDHC) card, a memory stick card, a smart media card (SM), a multi media card (MMC), an embedded MMC (eMMC), a compact flash (CF) card, or the like.

The media processing unit 1170 may be a unit that may process data processed in the processor 1100 or data input from an external input device and outputting a processing result to an external interface device so that the processing result may be transferred in video, a voice, and other types. The media processing unit 1170 may include a GPU, a DSP, a HD audio, a high definition multimedia interface (HDMI) controller, or the like.

Figure 7:
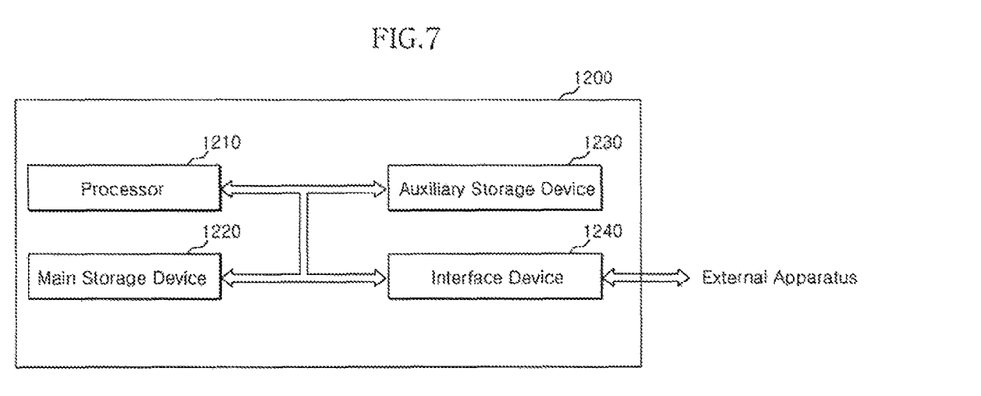
FIG. 7 is a block diagram illustrating a system according to an embodiment of the present disclosure.

As illustrated in FIG. 7, a system 1200 to which the semiconductor memory apparatus according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate by using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing an operation, comparison, and the like of data stored in the system, and may be formed of a MPU, a CPU, a single/multi core processor, a GPU, an AP, a DSP, or the like.

The main storage unit 1220 is a storage place that may receive a program or data from the auxiliary storage device 1230 and execute the program or the data. The main storage device 1220 retains the stored content even in power off, and may include the semiconductor memory apparatus according to the above-described embodiments. The main storage device 1220 may use a semiconductor memory apparatus which may cause the same amount of current to flow to all resistive memory elements regardless of distances from the driving driver. The detailed configuration of the semiconductor memory apparatus may be the same as the structures illustrated in FIGS. 2-4.

The main storage device 1220 according to the embodiment may further include an SRAM or a DRAM of a volatile memory type in which all contents are erased in power off. Alternatively, the main storage device 1220 may not include the semiconductor memory apparatus according to the embodiments but may include an SRAM or a DRAM of a volatile memory type in which all contents are erased in power off.

The auxiliary storage device 1230 is a storage device that may store a program code or a data. The auxiliary storage device 1230 may have a lower data processing rate than that of the main storage device 1220, but may store a large amount of data and include the semiconductor memory apparatus according to the above-described embodiments. The auxiliary storage unit 1230 may also use a semiconductor memory apparatus which may cause the same amount of current to flow to all resistive memory elements regardless of distances from the driving driver. The detailed configuration of the semiconductor memory apparatus may be the same as the structures illustrated in FIGS. 2-4.

An area of the auxiliary storage device 1230 according to the embodiment may be decreased, to reduce a size of the system 1200 and increase portability of the system 1200. Further, the auxiliary storage device 1230 may further include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Unlike this, the auxiliary storage device 1230 may not include the semiconductor memory apparatus according to the above-described embodiments but may include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card.

The interface device 1240 may exchange a command and data of an external apparatus with the system of the embodiment, and may be a keypad, a keyboard, a mouse, a speaker, a mike, a display, a variety of Human Interface Devices (HIDs), or a communication device. The communication device may include all modules such as a module coupled to a wired network or a module coupled to a wireless network. The wired network module may include a LAN, a USB, Ethernet, a power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

As specifically described above, the semiconductor memory apparatus in accordance with the embodiments of the present disclosure may improve the reliability and stability of read and write operations by causing the same amount of current to flow to all resistive memory elements selected by column addresses and row addresses.

The above embodiments of the present invention are illustrative and not limitative. Various alternatives and equivalents are possible. The invention is not limited by the embodiments described herein. Nor is the invention limited to any specific type of semiconductor memory apparatus. Other additions, subtractions, or modifications are obvious in view of the present disclosure and are intended to fall within the scope of the appended claims.

What is claimed is:

1. A processor, comprising:
a processor configured to interpret a command input from the outside and control an operation of information according to an interpretation result of the command;
an auxiliary storage device configured to store a program for interpretation of the command, and the information;
a main storage device configured to transfer the program and information from the auxiliary storage device and store the program and the information so that the processor performs the operation using the program and information when the program is executed; and
an interface device configured to perform communication between the outside and one or more among the processor, the auxiliary storage device, and the main storage device,
wherein at least one of the auxiliary storage device and the main storage device includes a semiconductor memory apparatus comprising:
a driving driver unit configured to provide voltages with different voltage levels to a plurality of respective resistive memory elements in response to a column select signal;
a plurality of current sink units configured to flow current from one of the plurality of resistive memory elements to a ground terminal in response to a plurality of word line select signals; and
a sink current control unit configured to control the plurality of current sink units to flow different amounts of current from the plurality of current sink units to the ground terminal.

2. The semiconductor memory apparatus according to claim 1,
wherein the driving driver unit comprises:
a driving driver configured to provide a driving voltage in response to the column select signal; and
a plurality of resistor elements electrically coupled in series to be inputted with an output of the driving driver, and
wherein the resistive memory elements are electrically coupled to respective nodes where the plurality of resistor elements are electrically coupled.

3. The semiconductor memory apparatus according to claim 2,
wherein the plurality of current sink units are electrically coupled to the plurality of respective resistive memory elements, and
wherein one of the plurality of current sink units is activated in response to the plurality of word line select signals.

4. The semiconductor memory apparatus according to claim 3, wherein the current sink control unit differentiates amounts of current flowed by the plurality of current sink units electrically coupled to the plurality of respective resistive memory elements, according to respective distances between the driving driver and the plurality of resistive memory elements.

5. The semiconductor memory apparatus according to claim 4, wherein the current sink control unit is configured such that an amount of current flowed from a current sink unit electrically coupled with a resistive memory element close to the driving driver, to the ground terminal, is smaller than an amount of current flowed from a current sink unit electrically coupled with a resistive memory element distant from the driving driver.

6. The semiconductor memory apparatus according to claim 5,
wherein the current sink control unit comprises a plurality of resistor elements which are electrically coupled in series, and
wherein the plurality of resistor elements are respectively electrically coupled to the plurality of current sink units, and the ground terminal is electrically coupled to a resistor element which is farthest from the driving driver.

* * * * *